United States Patent [19]
Schmid et al.

[11] Patent Number: 5,350,930
[45] Date of Patent: Sep. 27, 1994

[54] CLUSTER COMPOUND MICROELECTRONIC COMPONENT

[76] Inventors: Günter Schmid, Klippe 39 B, 5620 Velbert 11; Günter Schön, Lieversbank 16, 4300 Essen 13; Ulrich Simon, Ottenkämperweg 36, 4300 Essen 12, all of Fed. Rep. of Germany

[21] Appl. No.: 41,239

[22] Filed: Mar. 31, 1993

[30] Foreign Application Priority Data

Apr. 9, 1992 [DE] Fed. Rep. of Germany ....... 4212220
Dec. 15, 1992 [DE] Fed. Rep. of Germany ....... 4242367

[51] Int. Cl.[5] .................... H01L 27/12; H01L 29/161
[52] U.S. Cl. ........................................ 257/14; 257/12; 257/28; 257/183
[58] Field of Search ....................... 257/12, 14, 28, 183

[56] References Cited

U.S. PATENT DOCUMENTS

| | | | |
|---|---|---|---|
| 3,893,148 | 7/1975 | Madjid | 257/28 |
| 5,032,877 | 7/1991 | Bate | 257/25 |
| 5,037,732 | 8/1991 | McDugle et al. | 430/567 |
| 5,059,001 | 10/1991 | Shimizu | 257/21 |
| 5,182,788 | 1/1993 | Tanaka | 257/14 |
| 5,253,258 | 10/1993 | Lawandy | 359/326 |

FOREIGN PATENT DOCUMENTS

| | | |
|---|---|---|
| 0066287 | 6/1982 | European Pat. Off. . |
| 4102573 | 9/1991 | Fed. Rep. of Germany . |

OTHER PUBLICATIONS

*Physik in unserer Zeit* (Physics Today), 23. 1993, vol. 4, pp. 159–165.
*Scientific American*, "Single Electronics", Jun. 1992, pp. 50–55.
*Materials Research Society*, Apr., 1992, pp. 157–175.
Spektrum der Wissenschaft, Issue 1991, p. 28 ff *J. Vac. Sci. Technol.*, B 8 (2), 1990, 242, 245.
*Rompp Chemie Lexikon*, 9th edition, vol. 1, 1989, pp. 754, 755.

*Primary Examiner*—William Mintel
*Assistant Examiner*—Mahshid Saadat
*Attorney, Agent, or Firm*—Sixbey, Friedman, Leedom & Ferguson

[57] ABSTRACT

The invention relates to a microelectronic component with a component body determining the electronic properties of the component and functioning on the basis of a quantum wire or quantum point system. The the component body is formed of at least one, but in most cases a plurality of cluster molecules which adjoin one another, and the cluster molecules are formed of a metallic cluster nucleus and nonmetallic (insulating) ligand shell externally shielding and stabilizing the cluster nucleus. The cluster nucleus of the cluster molecules is formed of atoms of a transition metal, preferably silver (Ag), gold (Au), cobalt (Co), palladium (Pd), platinum (Pt), rhodium (Rh), Ruthenium (Ru).

38 Claims, 3 Drawing Sheets

CLUSTER COMPOUND MICROELECTRONIC COMPONENT

BACKGROUND OF THE INVENTION

1. Field of the Invention

The invention relates to a microelectronic component with a component body determining the properties of the component and with at least two connecting electrodes electrically connected with the material of the body for electric bonding toward the outside, especially in an electronic circuit, or wherein the component body consists of at least one cluster compound having a metallic cluster nucleus and nonmetallic (insulating) ligand shell shielding and stabilizing the cluster nucleus toward the outside.

2. Description of Related Art

Microelectronic components are individual parts of electronic circuits or systems in which they can perform various functions, especially production and conversion of electric signals, logic functions, etc. Now, microelectronic components are normally semiconductor components in chip technology. The semiconductor material is in most cases silicon.

The latest research in semiconductor materials tends to use electron quantum effects for new actions and a reduction in size of the structures. So-called quantum-wave structures have already become known. They are structures in which a thin layer of a semiconductor with a small energy gap is embedded between thicker layers of a semiconductor with a greater energy gap. The embedded layer is a few nanometers thick, it is thinner than the free path length of the electrons. The limitation of the movement leads to a quantizing of the kinetic energy. But, this quantizing is limited only to one dimension; in the layer, the electrons can freely move, so that a two-dimensional electron gas results. The associated result is a structural density by steps of the two-dimensional electron gas. It is now attempted to further quantize the quantum-wave structures with a two-dimensional electron gas, i.e. to limit and to quantize the movement of the electrodes in another direction in space—quantum-wire—or even in all three directions in space—quantum-box/quantum point. In the case of a quantum point, the structural density would consist of a series of singular energy states. But, the production of quantum points in practice has not, as yet, been achieved. However, quantum-wave semiconductor lasers and quantum-wave transistors are already known.

Also, in great research laboratories, studies are now made at considerable cost to produce quantum-wave structures up to quantum-point structures in semiconductor materials (Spektrum der Wissenschaft [Spectrum of Science, which is the German edition of Scientific American]) Sonderheft "Ultrarechner" [Special Issue "Ultracomputer"], Issue 1991, p. 28 ff). In these tests, the operation is always performed with semiconductor materials, but with gallium arsenide or aluminum gallium arsenide not with silicon.

A process for the production of a microelectronic component with quantum points of semiconductor material placed on a substrate is known (gallium arsenide; published German Application 41 02 573 A1). Here, gallium arsenide clusters are accelerated and deflected by electric and magnetic fields so that only clusters of certain sizes strike the substrate and thus form quantum points with defined properties. Thus, this is also a process for scientific purposes relative to semiconductor materials, in which a reference to a microelectronic component operating in practice is still lacking.

Producing metallic quantum-wave structures in semiconductor base materials is also known per se; in this case, it involves ultrathin continuous layers (thickness of 1 nm) produced by molecular beam epitaxy and not cluster structures. Here, there are attempts for the configuration of a microelectronic component by bonding three terminals on such a metallic quantum point embedded in semiconductor material (J. Vac. Sci. Technol. B 8 (2), 1990, 242, 245).

Cluster compound (also called complex compounds or coordinate compounds) which are formed of organometallic molecular clusters having a metallic cluster nucleus and nonmetallic ligand shell are known in the art, and they have long been of considerable interest because of their special bonding ratios between covalent and metallic chemical bonds, because of their polyhedral structures and because of their reactivity (Römpp Chemie Lexikon, 9th edition, Volume 1, 1989, pages 754, 755). The ligand shell protects the metallic cluster nucleus from combining with cluster molecules adjoining the metallic cluster nucleus, it stabilizes the metallic cluster nucleus so that cluster molecules with metallic cluster nuclei are largely inherently stable. Special tests were performed for transition metal cluster compounds (published European Application No. 0 066 287). In this prior art, especially $M_{55}$ cluster compounds were studied, their special suitability as catalysts in the catalytic hydrogenation, and also for metal coating of any surface was determined (loc. cit., page 2, lines 56 to 62, M=Au, Rh, Pt, Ru).

The above explanations make it evident that in the field of the quantum-wave, quantum-wire or quantum-point systems, intensive research activity is taking place, but which shows only first attempts to achieve microelectronic components that are able to function in practice, not just theory. Furthermore, while cluster compounds are known, they have not been used to achieve a microelectronic component.

SUMMARY OF THE INVENTION

The primary object of the invention is, therefore, to provide a microelectronic component which will function in practice on the basis of a quantum-wave, quantum-wire or even quantum-point system that will achieve as wide a range of use as possible.

The above object and others are achieved by providing a component body comprised of at least two, but in most cases of numerous, molecular cluster, adjoining one another, of a metallic cluster nucleus and nonmetallic (insulating) ligand shell shielding and stabilizing the cluster nucleus toward the outside.

As the statements provided above make clear, all researchers now focus on quantum-wave systems with semiconductor materials as they are anyhow practically always used in microelectronic components. According to the invention, the finding has been made, on the other hand, that for the range of catalysts and for metal coating, cluster compound, also known for some time, with metallic cluster nucleus and nonmetallic ligand shell make possible the structure of microelectronic components with amazing properties. In this connection, it has been recognized that cluster compounds with metallic cluster nucleus with the correct selection of size in their properties anyhow lie at the boundary between metal and semiconductor, while cluster compounds of semiconductor materials are to be placed near the semiconductor/insulator transition in their properties. The desired properties of microelectronic components are thus better achieved, perhaps really only with organometallic cluster compounds, according to the finding of the invention.

The invention has further provided the finding that a correctly dimensioned metal cluster nucleus practically forms a quantum point that is insulated and stabilized by the ligand shell. These quantum points can easily be produced chemically without any special effort, the processes necessary for this purpose being available (see published European Application 0 066 287), quite in contrast to the extremely difficult processes in the field of semiconductor materials. Unlike in the separation of molecular clusters in a network of zeolites, the cluster molecules used here, since they are stable in themselves, easily lie adjoining one another.

The fact that the cluster compounds, from which the component body of the microelectronic component according to the invention is designed, adjoin one another with the ligand shells, prevents a connection between the metallic cluster nuclei of adjacent molecular clusters, but makes possible a tunneling through of the ligand shells by correspondingly high-energy or suitably high-energy electrons. This, thus yields a tunnel conductivity, namely a quantized tunnel conductivity with single electrons, finally, in such a microelectronic component, yields a plurality of electron-conducting quantum channels (quantum wires).

An important advantage of the microelectronic component according to the invention lies in the fact that it can (without having to) be operated at room temperature. The size of the tunnel contacts and of the achievable tunnel capacitances is important. The smaller the latter are, the greater the microswitching time is and the higher also the operating temperature. Since with the microelectronic component of organometallic cluster compounds, contact dimensions of at most 1 nm are attained, contact properties dependent only on quantum properties are produced. The result is the quantized tunnel conductivity described here with single electrons (QSET=energy-quantized single electron tunneling). The tunnel capacitances are around one to two powers of ten less than in the standard single electron tunneling (SET) described in the literature, which occurs without quantizing possibilities. Instead, at minimum temperatures of a few Kelvin, the operation can be performed at room temperature with oscillation times down to femtosec.

With the microelectronic component according to the invention, a breakthrough in the direction of further miniaturization in the field of microelectronics has been achieved. Compared with 250 nm of space requirement on a chip for previously known transistor elements, a quantum wire consisting at least of two metal cluster molecules only has dimensions of 2 to 4 nm.

For the microelectronic component according to the invention, atoms of a transition metal have been found to be useful as materials for the metal of the cluster nucleus. In particular gold seems particularly suitable, extensive tests having been performed and successfully concluded with gold.

The size of the cluster molecule is also of considerable importance for the teaching of the invention, and in this regard, the atoms the cluster nuclei are present as two shells in close-packed sphere packing of $M_{55}$ (55 metal atoms) form or larger. It is known that in cluster compounds of this order of magnitude, the metal atoms are regularly present in close-packed sphere packing. In close-packed sphere packing, a spherical shell of 12 atoms is produced around an inner first atom. There are then $10 n^2+2$ atoms on every further spherical shell. A two-shell metal cluster is thus an $M_{55}$ cluster, especially an $Au_{55}$ cluster molecule, has proven an excellent possibility for achievement of a microelectronic component. The assumption is that the next smaller $Au_{13}$ cluster molecule already has semiconducting properties that are too strong to be still usable for a microelectronic component. Larger cluster compounds are usable, but increase the space requirement.

The cluster nucleus of an $Au_{55}$ cluster forms a three-dimensional limited space, in which there are two free electrons (Pauli Principle), which occupy exactly quantized energy states. This will be further explained more exactly.

With this microelectronic component, a stimulus is achieved which acts on the macroscopic component body of a plurality of molecular clusters. A bonding of the component body with connecting electrodes is necessary by which first a tunnel current of single electrons flows when applying a sufficient dc voltage. The quiescent current, which results from the applied dc voltage and is based on the tunnel current of single electrons can then be changed in that the free electrons of each quantum point (in the case of $Au_{55}$ cluster molecules, two free electrons) are quantum-mechanically activated in an additional process. This can be interpreted as a resonance process, resonance vibration of the free electron gas in the quantum point in the ground state. The frequency of 60 kHz macroscopically determined here in $Au_{55}$ clusters results at room temperature on a pressed, macroscopic component body in an abrupt doubling of the flow of current by the quantum channels formed in the component body.

It is not essential how the component body of the microelectronic component according to the invention actually is macroscopically provided. Microscopically, the use of only two molecular clusters, which is the minimum number by which a microquantum channel is formed, is conceivable. But normally, the operation is performed with a plurality of molecular clusters. In the production processes known from the prior art, molecular clusters are attained in the form of a granulate or powder. These molecular clusters can be taken up and correspondingly bonded as a bed in a receptacle. But, it is especially suitable that the molecular clusters are pressed in large numbers under high pressure, preferably a pressure of at least about $10^8$ Pa, into a mechanically interconnected component body.

Of course, it is more suitable to have a mechanically interconnected component body that is manageable as such. This has also been successful in tests. The component body (pressed disk) produced in this connection is a small disk with a diameter of 5 mm and a thickness of 0.379 min. In general, it is probably suitable that the component body, especially the component body that has resulted by pressing under high pressure, has maximum lateral dimensions (especially a diameter) of a few mm, preferably of 2 to 10 mm, especially of about 5 mm, and a thickness of 0.1 to 1.0 mm, especially of about 0.4 mm.

Independent of whether the connecting electrodes are applied to the component body after its production or are directly connected during pressing with the material of the component body, it is advisable in any case to place the latter on two surfaces of the component body opposite one another so that the previously described, suitable quantum channels (series of cluster molecules adjoining one another which each fore a quantum point) form between the connecting electrodes in the component body.

By applying a dc voltage to the connecting electrodes, a tunnel current of single electrons flows first through the quantum channels (de voltage, for example, of 0.1 to 5 V). This quiescent current can be easily tolerated. It has now been shown that with correct handling of the microelectronic component, the quiescent current, which results from an applied dc voltage and is based on the tunnel current of single electrons, can be changed in that the free electrons of each quantum point are quantum-mechanically activated. This takes place, e.g., by applying a certain alternating frequency (for example, at room temperature and an $Au_{55}$ cluster, a macroscopic frequency of 60 kHz) in which suddenly the flow of current through the quantum channels abruptly doubles. If a dc voltage is again superimposed on the alternating voltage, the frequency (resonance frequency/operating frequency) thus can change.

With a microelectronic component according to the invention, as previously described, a resistance based on a quantized tunnel effect can thus be achieved, which abruptly changes into a resonance, i.e., a tunnel resonance resistance. The tests conducted according to the invention have shown, in this connection, that the quantum channels of molecular clusters formed between the connecting electrodes in the component body can be controlled by transverse voltages, by which parallel quantum channels can interact with one another crosswise to the main direction of the current, namely in a way that can be influenced externally.

The connecting electrodes, and optionally also the corresponding control electrodes, can suitably be designed as a grid of single microelectrodes separated from one another. Tests have shown that at a sufficient lateral distance of the microelectrodes from one another, the quantum channels opened up between the microelectrodes opposite one another hardly influence one another or not at all. Thus, an extremely large number of tunnel resonance resistances, that can be controlled in each case for themselves, could be produced on a minimal surface with the microelectronic component according to the invention.

If the interactions of quantum channels adjacent to one another are used, the principle of a "cellular automatic machine" is achieved (see *Spektrum der Wissenschaft*, loc. cit., page 38, right column). This makes use of the fact that, in the component body produced according to the invention, the molecular clusters, as such, are also present again in close-packed sphere packing (in any case, if the operation is performed with high pressing power) and therefore, in principle, each molecular cluster adjoins its twelve closest neighbors This is called "massive parallelism," an effect which can be used, especially if other control electrodes are produced in addition to the connecting electrodes.

An important advantage of the microelectronic component according to the invention lies in the fact that it can be operated at room temperature That is, there is a complete microelectronic operability without having to go to very low temperatures.

In principle, it can be assumed that microelectronic components on the basis of the organometallic cluster compound according to the invention can be produced with a wide range of metals with a suitable chemical protective (ligand) shell. The cluster nuclei, in principle, can have between 13 and more than 1,000 atoms, and a center of gravity, special under all aspects, with especially advantageous properties would probably lie at the double-shell $M_{55}$ cluster.

With the indicated pressing powers and on the basis of an $Au_{55}$ cluster, a pressed element produced according to the invention, as a component body, has a density of about 3.3 to 3.7 $g/cm^3$, which is very close to the theoretically determined value for the close-packed sphere packing in this case. It operates at room temperature, but also at lower temperatures, and impurities in the sample are insignificant since roundabout paths are opened up for the quantum channels, when impurities occur, without the resistance being increased. This is in general an important characteristic of the microelectronic component according to the invention, namely that the conductivity of a single molecular cluster is equal to the conductivity of the entire quantum channel. As a result, the abrupt doubling of the tunnel current in reaching a resonance frequency, and the thus caused use of the second electron for conduction purposes, can be explained in the case of the $Au_{55}$ cluster.

The basis for another, independent teaching of the invention is another physical finding to the effect that both the tunnel process and the resonance process with the macroscopically determined frequencies for the stimulus (e.g., 60 kHz in the case of $Au_{55}$ clusters in the macroscopic component body) can be attributed by a quite simple relation to the microscopic frequency of the cluster molecules themselves. The microscopic frequency of the molecular clusters themselves in the case of $Au_{55}$, as an example, lies in the frequency range of light ($10^{13}$ to $10^{14}$ Hz). If this frequency is multiplied by the absolute value of the double nuclear diameter of the cluster nucleus, a macroscopic resonance frequency thus results in which the doubling of the flow of current explained above occurs $(2 \times 3)$ (nm) $10^{-9} \times 10^{13} = 6 \times 10^4 = 60$ kHz). This is, in final analysis, the interpretation as Debye frequency for a low-frequency resonance process.

The tunnel process, which can be excited with dc voltage., has also found a similarly simple explanation. This can also be initiated with an external frequency, which corresponds to double the excitation frequency for the resonance process. That can be understood as attaining a first excited state of the electron gas and thus providing the necessary tunnel probability, the corresponding Cole-Cole frequency is double the Debye frequency.

The previously explained findings made clear the possibility of controlling a microelectronic component of the type being discussed with ultrahigh frequency waves especially in the frequency range of light as an excitation parameter. In other words, the microscopic frequency itself can be convened at room temperature, by phase coupling by the cluster diameter, to a macroscopic frequency in the kilohertz range, and the latter does not depend on the geometry of the macroscopic component body. Conversely, because of the defined phase relation between macrofrequency and microfrequency, when applying a correspondingly matching macrofrequency in the kilohertz range, there is resonance with the corresponding microfrequency in the ultrahigh frequency range (light, here in the example of $Au_{55}$). The equivalent applies to the ground state and the thus linked resonance process as well as to the first excited state and the thus linked tunnel process (tunnel resonance effect).

The possibility to stimulate the microelectronic component with an ultrahigh frequency wave, especially in the frequency range of light as an excitation parameter, provides completely new possibilities of use for the microelectronic component according to the invention based on organometallic cluster compounds.

These and further objects, features and advantages of the present invention will become apparent from the following description when taken in connection with the accompanying drawings which, for purposes of illustration only, show several embodiments in accordance with the present invention.

BRIEF DESCRIPTION OF THE PREFERRED EMBODIMENTS

DETAILED DESCRIPTION OF THE PREFERRED EMBODIMENTS

Figure 1A:
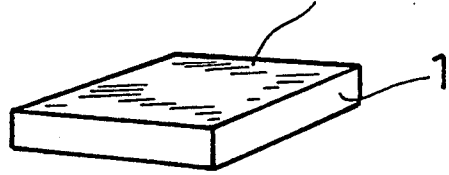
FIGS. 1a–1d are diagrammatic examples of various macroscopic forms for a microelectronic component in accordance with the present invention.

FIG. 1 diagrammatically represents macroscopic block forms for a microelectronic component having a component body 1 on which a connecting electrode 2 is electrically connected with the material of component body 1 at each of its top and bottom surfaces (only upper connecting electrode 2 being shown). However, a connecting electrode 2 does not necessarily have to be present since the microelectronic component, under certain circumstances, can also be stimulated in a contactless manner. It is essential that component body 1 of the microelectronic component comprise at least one, here plural, molecular clusters 3 of a cluster compound each of which has a metallic cluster nucleus 4 and nonmetallic (insulating) ligand shell 5. Ligand shell 5 (FIG. 2) externally shields metallic cluster nucleus 4 and simultaneously stabilizes it.

Figure 2:
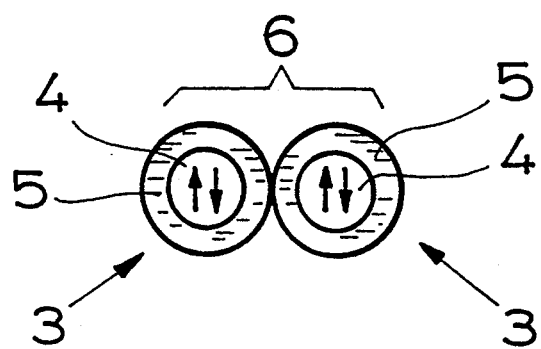
FIG. 2 depicts a "quantum channel" of two cluster molecules as a basic representation for the mode of operation of the microelectronic component according to the invention.

Two free electrons, which are enclosed in this quantum point (quantum box) according to the Pauli principle, are represented in cluster nucleus 4 (FIG. 2). For example, with gold (Au), which has been found very suitable for use in accordance with the present invention, in a double-shell close-packed sphere packing of 55 metal atoms. In this connection, it is essential to note that metal molecular clusters 3 can also be multi-shell or only single-shell, and the properties of molecular clusters 3, within certain limits, can also be produced with a specific target.

Examples of suitable cluster compounds are $M_{309}$ and $M_{561}$ cluster compounds, such as $Pt_{309}$ $phen_{36}$ $O_{30}$ and $Pd_{561}phen_{36}$ $O_{200}$. Ligand shell 5 of cluster compounds 3 is made of phosphane molecules $PR_3$ and chlorine atoms (formula $Au_{55}$ $[P(C_6H_5)_3]_{12}$ $Cl_6$) in a way known in the art, and it is used in the insulation against ion conduction, the separation of cluster nuclei 4 of adjacent molecular clusters 3 from one another and the mechanical stabilization of respective molecular clusters 3 by themselves.

Cluster 3 of $Au_{55}$, diagrammatically represented in FIG. 2, has an outside diameter of about 2 nm, with a nuclear diameter of about 1.4 nm. It operates at room temperature, but also at lower temperatures, and impurities in the sample are insignificant since roundabout paths are opened up for the quantum channels, when impurities occur, without the resistance being increased. This is in general an important characteristic of the microelectronic component according to the invention, namely that the conductivity of a single cluster is equal to the conductivity of the entire quantum channel. As a result, the abrupt doubling of the tunnel current in reaching a resonance frequency, and the thus caused use of the second electron for conduction purposes, can be explained in the case of the $Au_{55}$ cluster.

By way of example, the known cluster compound $Au_{55}]P(C_6H_5)_3]_{12}Cl_6$ can be produced in the following known manner. A 250 ml three-necked flask, provided with stirrer, internal thermometer, gas feed pipe and reflux condenser is fed under argon as protective gas with 3.94 g of $(C_6H_5)_3PAuCl$ (7.9 mmol) and 150 ml of anhydrous benzene. With stirring, a moderate stream of diborane is directed through the solution, which is immediately colored violet, later dark brown. During the feeding, the temperature in the reaction vessel is increased to 50° C. After 30 to 60 minutes, a dark precipitate settles, while the supernatant solution is almost colorless. The precipitate is filtered off by a reversing frit and dissolved in as litter methylene chloride as possible. In this connection, a dark red-brown solution forms, from which a dark brown substance is precipitated after the renewed fritting by mixing with petroleum ether. For further purification, it is again dissolved in methylene chloride and filtered over a 4 to 5 cm thick layer of diatomaceous earth to separate possible adhering residues of colloidal gold. After renewed precipitation, 0.8 g of $Au_{55}P(C_6H_3)_3]_{12}Cl_6$ (39.0%, relative to the triphenylphosphenegold used) is obtained.

Figure 1B:
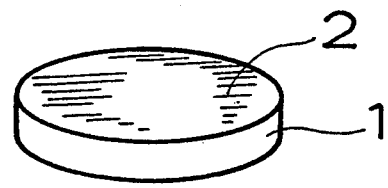
Figure 1C:
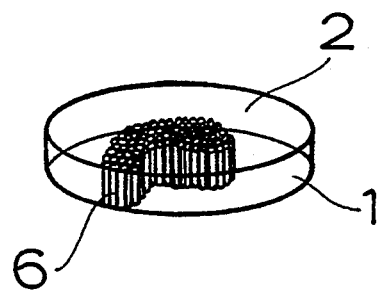
Figure 1D:
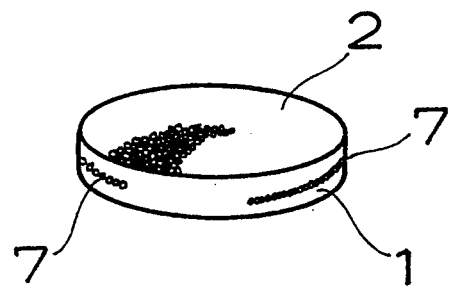

While FIG. 1a shows a block-like pressed part of molecular clusters 3, FIGS. 1b–1d show disk-shaped component bodies 1. Such pressed parts can be produced by placing a quantity of granular or powdered cluster molecules (which have been produced in a known manner such as that described in the preceding paragraph for $Au_{55}P(C_6H_5)_3]_{12}Cl_6$) into a cylindrical press die, applying a press dolly thereon, and applying pressure (preferably, at least $10^8$ Pa) to the dolly to compress the clusters so as to cause them to bond together into a mechanically interconnected component body. Additionally, the connecting electrodes 2 can be place in the die and simultaneously bonded with the material of the component body 1 by the pressing operation by which it is formed. Alternatively, the granular or powdered molecular clusters could be placed in a receptacle and chemically bonded together or a layer of the molecular clusters can be placed in a receptacle and bonded to an electrode; however, pressing is preferred.

On the basis of an $Au_{55}$ cluster, a pressed element produced according to the invention, as a component body, has a density of about 3.3 to 3.7 g/cm³, which is very close to the theoretically determined value for the close-packed sphere packing in this case. A preferred diameter would be, for example, 5 mm at a thickness of about 0.4 mm; although, a diameter range of 2–10 mm and a thickness range of 0.1–1.0 mm would be suitable.

In this case, connecting electrodes 2 are placed on the surfaces of component body 1 opposite one another, and are designed as grids of single, separated microelectrodes in the embodiments represented in FIGS. 1c and 1d. Thus, as a result, quantum channels 6 are obtained parallel to one another between the single microelectrodes or a series of microelectrodes. These quantum channels that are opened up between the opposed microelectrodes do not or hardly influence one another. Thus, an extremely large number of tunnel resonance resistances, that can be controlled in each case for themselves, can be produced on a minimal surface with the microelectronic component according to the invention.

In addition to connecting electrodes 2, FIG. 1d also shows control electrodes 7, by which a control voltage can be applied crosswise to the connecting voltage applied by connecting electrodes 2 on component body 1, so that quantum channels 6 are influenced in a crosswise direction. With the embodiment according to FIG. 1c, crosscurrents can be designed and used between quantum channels 6, thus the "massive parallelism" of the quantum points explained above is already produced. Thus, the principle of operation of a "cellular automatic machine" (noted at page 10, above) is achievable. The provision of additional control electrodes 7 in the embodiment according to FIG. 1d is especially suitable for producing influencing cross currents. As a result, an enormous plurality of parallel channels can be controlled in an extremely small space so that, for example, the entire flow of current over the microelectronic component can be controlled according to the invention, or other, also nonlinear, effects can be achieved.

It is essential that the microelectronic component according to the invention can be operated not only at low temperatures but also and especially at room temperature. Special conditions do not even have to be provided for the ambient atmosphere, although an inert gas atmosphere is advantageous for the operation.

The production of component body 1 by pressing a bed of molecular clusters 3 under high pressure is only one form of production under a plurality of possible forms of production. For example, a thin-layer application on substrates could also be an advantageous fore of production of component body 1, that will be considered later on in more detail.

Figure 3A:
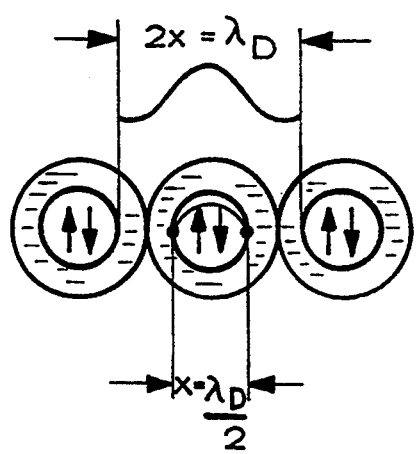
FIGS. 3a and 3b are one-dimensional model representations of the phase coupling conditions for resonance effect, on the one hand, and tunnel effect, on the other hand, in the example of $Au_{55}$.

FIG. 3 now shows a diagram, which facilitates the understanding of the physical explanation for the phenomena occurring in a very simplified representation. In FIG. 3, on the left, the resonance process in molecular clusters 3 is explained by the example of the $Au_{55}$ cluster. In the ground state, both free electrons located in cluster nucleus 4 can be assigned an inherent oscillation with Debye wavelength $\lambda_D$ or Debye frequency $\gamma_D$. Nuclear diameter x of cluster nucleus 4 of 1.4 nm corresponds to half Debye wavelength $\lambda_D/2$.

Microscopic Debye frequency $\gamma_{D1\,micro} \approx 10^{13}-10^{14}$ Hz is coupled with the macroscopic Debye frequency by the diameter of cluster nucleus 4 according to the following formula:

$$\gamma_{D1macro} = 2|X| \cdot \gamma_{D1micro}$$

$|X| = 1.4 \cdot 10^{-9}$ (in the case of $Au_{55}$; dimension m)

It results from the above that the resonance process can be excited macroscopically by a frequency in the kilohertz range (60 kHz in the case of $Au_{55}$) just as by microscopic frequency $\gamma_{D1micro}$, the direct resonance frequency of the free electron gas in the quantum box formed by cluster nucleus 4.

Figure 3B:
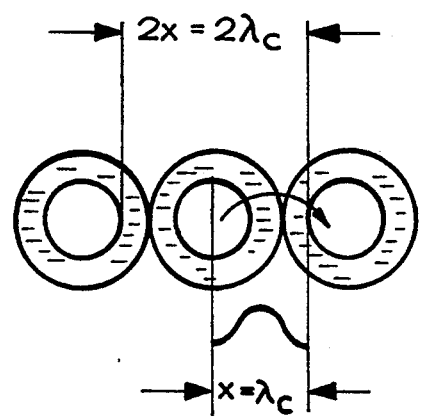

A similar phase coupling of a macroscopic frequency to a microscopic frequency applies to the tunnel effect in FIG. 3b. This can be interpreted as the first excited state of the electron gas with the tunneling of an electron through ligand shells 5 of adjacent molecular clusters 3. The Cole-Cole frequency is involved here, which is broad-band because of the tunnel capacitances in contrast to the resonance frequency (CPE behavior, constant phase element). Length x corresponds in this connection to the Cole-Cole wavelength (the full wavelength, not the half wavelength, since the first excited state is involved). By the excitation of the electron gas, the Coulomb barrier is overcome by an excited electron, it is no longer located in cluster nucleus 4 but leaves cluster nucleus 4 through ligand shell 5 (tunnel effect).

The equations for the phase coupling with example $Au_{55}$ are based on the circumstance that, in this example, the thickness of ligand shell 5 corresponds to a fourth of the diameter of cluster nucleus 4, i.e. the double thickness of ligand shell 5 relevant to the tunnel effect amounts to half nuclear diameter x. Other numerical ratios can be specifically synthesized, in the case of $Au_{55}$, two other thicknesses can be experimentally achieved. Other phase coupling equations, which lead to other ratios of frequencies or wavelengths, then follow from the above. By specific change of the surrounding area of cluster nucleus 4 (ligand shell 5, optionally embedding medium or embedding matrix), the frequency ratios can thus also be specifically changed in the microrange as well as in the macrorange. The tunneling in the excited states of the electron gas can even be completely prevented by suitable enlargement, for example, of ligand shell 5. This could be an important concept for a laser effect.

In the bibliographic reference "Physik in unserer Zeit," loc. cit., the meaning of the Coulomb barrier for the case of single electron tunneling (SET) is described, but in this case, the distinction consists in the fact that the electron supply does not come from the electron gas in a metal (standard conducting or superconducting), but that only respective single electrons with quantized energy states are available (this is following the quantum point structure, which is specified by cluster nucleus 4 of molecular clusters 3). Energy-quantized single electron tunneling (QSET) is thus achieved.

As described in the previously indicated bibliographic reference, the action of the Coulomb barrier is that with constant current supply, charge and voltage oscillate, and the frequency is determined solely by the current $f_{set} = I/e$. This applies, with the boundary condition of quantizing the energy states, also in this case.

The following equation for the tunnel effect is obtained:

$$\gamma_{ccmicro} = 2 \cdot \gamma_{Dmicro}$$

$$\gamma_{ccmacro} = 2 \cdot \gamma_{Dmacro} = 2|X| \gamma_{ccmicro}$$

In the example of $Au_{55}$, a macroscopic tunnel-excitation frequency results, but which is measured broadband, in the range of 120 kHz.

An important fact in the previously described finding that the energy difference between the ground state and the first excited state of the one-dimensional electron gas is correlated to frequencies which He in the visible range, in any case in the range of light between infrared and ultraviolet. This applies in any case to the example of $Au_{55}$ as the molecular clusters 3 discussed here.

As noted above a collective tunneling of single electrons with a specific current value in the first excited state of the electron gas can be produced by a dc voltage above a certain threshold value or with a macroscopic frequency, which is identified as $\gamma_{ccmacro}$ and which lies in the kilohertz range. The described tunnel-resonance effect (TER) is thus involved here. By excitation with the resonance frequency of cluster nucleus 4 itself, thus macroscopically by $\gamma_{Dmacro}$ in the case of $Au_{55}$ with a frequency of 60 kHz, another excitation process is added, which results in a doubling of the current.

According to the invention, it has now been recognized that the corresponding effects can be induced in the same way with the use of the corresponding microscopic frequencies $\gamma_{ccmicro}$ and $\gamma_{Dmicro}$. Thus, the stimulus, as an excitation parameter, can take place with ultrahigh frequency waves, especially in the frequency range of light.

Figure 4:
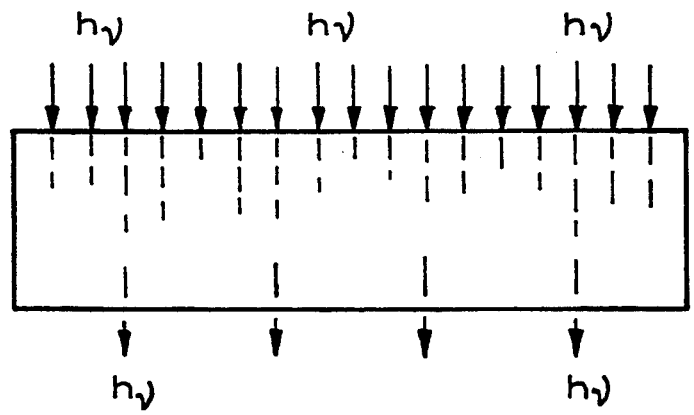
FIG. 4 is a diagrammatic representation of an exclusively optical control and coupling of a microelectronic component using cluster-resonance fluorescence.

The previously explained example of a microelectronic component controlled by light irradiation of the type being discussed, which could thus replace a phototransistor in function, although in many cases with a smaller space requirement, makes necessary, as before, an external electric connection of component body 1 in a circuit. However, the previously described finding according to the invention further makes it possible that component body 1 not only can be stimulated in a contact-free optical manner but also can be externally connected, especially in a corresponding circuit. The fully contact-free optical control and connection of the microelectronic component according to the invention in a circuit or in general toward the outside is thus achieved. In this connection, FIG. 4 makes clear an example which was produced on a pressed part of $Au_{55}$ molecular clusters 3 with a thickness of about 0.1 min. Such a pressed part is neither transparent nor porous, but nevertheless transmits visible light. This is indicated in FIG. 4 by corresponding arrows which are to indicate the light intensity. This can be interpreted as a photoluminescence effect by the fact that, i.e., light of the indicated frequency range is first absorbed but then again emitted. A type of cluster-resonance fluorescence is involved here, which results in that such a component body 1 finally acts as a "transparent" metal. It can thus be assumed that in an especially advantageous way, such a microelectronic component can be used as a light filter. An especially advantageous application is also the use as a laser, which can be optically pumped here.

It is advantageous that possible optoelectronic uses with a plurality of molecular clusters 3 adjoining one another can be considered feasible. In this case, an excitation by light would then be achieved, however a decoupling would be produced electrically by at least two connecting electrodes 2 on component body 1. A special use could thus be produced for a microelectronic component according to the invention as thin-layer element in solid-state photocells.

As is generally known, thin-layer photocells are widely used as solar cells, which are based on the principle that impinging photons produce pairs of holes and electrons in the semiconductor material, whereupon the latter are separated and thus a photocurrent flows. A thin layer of metal molecular clusters 3 can be inserted as a topmost layer of such a thin-layer component, which, for example, replaces n-silicon as a topmost thin layer.

Even though the stimulus takes place with frequencies in the range of radiofrequencies, especially in the range between 10 Hz and 10 MHz, advantageous optoelectronic effects can be produced. With simultaneous irradiation of light, namely a controlled absorption or emission of light by component body 1 can take place. If, for example, excitation takes place with macroscopic frequency $\gamma_{ccmacro}$ in the kilohertz range, then first an absorption of light with subsequent emission can be expected. A laser that can be pumped electrically can thus be produced. It has been experimentally proven that with application of frequencies in the range between 10 Hz and 10 MHz, the transparency of a macroscopic sample, i.e., of a corresponding component body 1 of a plurality of molecular clusters 3 adjoining one another, clearly decreases with the beginning of the increase of the macroscopic resonance (in the case of $Au_{55}$ in the range of 120 kHz). This is attributable to the fact that electrons, which participate in the tunnel process because of the macroscopic excitation, cannot absorb or emit any more light since they are already excited and collectively incorporated in the tunnel process. The effect of the collective excitation by a macroscopic excitation frequency in the kilohem range blocks an additional action of the microscopic Cole-Cole resonance frequency.

Figure 5:
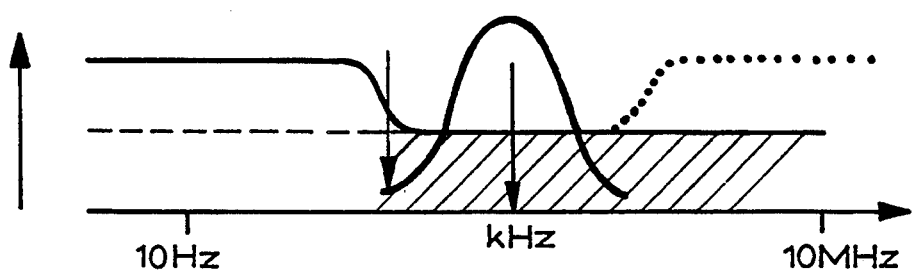
FIG. 5 is an illustration of the operating principle of a light filter based on the principle of cluster-resonance fluorescence.

As FIG. 5 shows, the "transparency" (continuous line) of the sample does not increase again at frequencies of the excitation parameter above the decaying of the macroscopic resonance, as actually ought to be expected corresponding to the curve drawn with points. In any case, the "transparency" remains for some time on the lower level. Possibly, effects similar to a phosphorescence are involved here. In any case, the system acts as a type of light filter, which is switchable by electric frequencies.

If a microelectronic component of the smallest dimensions, i.e., with a small number of molecular clusters 3, optionally also consisting of a single molecular cluster 3, is installed in a surrounding area of other material, especially semiconductor material, a microlaser could be produced from it. Of the several hundred layers of the adjoining semiconductor material, the necessary mirrors are formed, which form the resonator of the laser.

From the insulation of a molecular cluster 3 to the incorporation in a semiconductor material, the step is not far to the consideration to use molecular clusters 3 also in diluted systems, i.e., to dispersed a plurality of component bodies 1 of at least one molecular cluster 3, preferably a small number of molecular clusters 3, in a dilutent or embedding means. This has already been achieved experimentally with a statistical distribution in polystyrene in the case of $Au_{55}$ molecular clusters. Thus, storage media with diluted systems can be produced by stimulus of spatial groups of molecular clusters 3. But still further research is necessary here with respect to the search for suitable polar embedding means.

An essential area of use of the microelectronic component according to the invention with a component body 1, which consists of a plurality of molecular clusters 3, adjoining one another, is as a high-temperature superconductor.

The superconduction effect (Josephson Effect) shows another behavior, if by reduction of the contact dimensions, Coulomb energy Ec is comparable with the Josephson energy. These requirements are provided without problems in the case of metal molecular clusters 3 so that a superconduction effect in the high-temperature range can be expected with the use of corresponding molecular clusters 3.

While various embodiments in accordance with the present invention have been shown and described, it is understood that the invention is not limited thereto, and is susceptible to numerous changes and modifications as known to those skilled in the art. Therefore, this invention is not limited to the details shown and described herein, and includes all such changes and modifications as are encompassed by the scope of the appended claims.

We claim:

1. Microelectronic component having a component body comprised of at least one molecular cluster of a cluster compound, said molecular cluster having a metallic cluster nucleus and an insulating ligand shell externally shielding and stabilizing the cluster nucleus in a manner enabling excitation of free electrons in the cluster nucleus by action of an external excitation parameter on the at least one molecular cluster and means for applying said external excitation parameter to the component body.

2. Microelectronic component according to claim 1, wherein said component body comprises a plurality of adjoining molecular clusters of the cluster compound having a metallic cluster nucleus and an insulating ligand shell; and wherein said means for applying said external excitation parameter to the component body comprises at least two connecting electrodes which are mechanically connected with the cluster compound of the body as a means for electrically connecting the component to an electronic circuit.

3. Microelectronic component according to claim 1, wherein the cluster nucleus of the at least one molecular cluster consists of atoms of a transition metal.

4. Microelectronic component according to claim 1, wherein the cluster nucleus of the at least one molecular cluster comprises atoms of a metal selected from the group consisting of silver (Ag), gold (Au), cobalt (Co), palladium (Pd), platinum (Pt), rhodium (Rh), ruthenium (Ru).

5. Microelectronic component according to claim 3, wherein the atoms in the cluster nucleus of the at least one molecular cluster are present as two shells in close-packed sphere packing.

6. Microelectronic component according to claim 1, wherein the atoms in cluster nucleus of the at least one molecular cluster are present as two shells in close-packed sphere packing.

7. Microelectronic component according to claim 3, wherein the ligand shell of the at least one molecular cluster is made of phosphane molecules and chlorine atoms.

8. Microelectronic component according to claim 1, wherein the ligand shell of the at least one molecular cluster is made of phosphane molecules and chlorine atoms.

9. Microelectronic component according to claim 1, wherein the at least one molecular cluster has an outside diameter of about 2 nm, with a diameter of the cluster nucleus of about 1.2 to 1.6 nm.

10. Microelectronic component according to claim 2, wherein a layer of molecular clusters of the cluster compound are bonded together to form the component body by being bonded to the connecting electrodes.

11. Microelectronic component according to claim 1, wherein the component body is formed of powdered or granular molecular clusters of the cluster compound which have been pressed at a pressure of at least about $10^8$ Pa into a mechanically interconnected component body.

12. Microelectronic component according to claim 9, wherein said means for applying said external excitation parameter to the component body comprises at least two connecting electrodes which are mechanically connected with the cluster compound of the body as a means for electrically connecting the component to an electronic circuit, said connecting electrodes having been simultaneously bonded with the cluster compound of component body during the formation thereof.

13. Microelectronic component according to claim 12, wherein the component body has maximum lateral dimensions of 2 to 10 mm, and a thickness of 0.1 to 1.0 mm.

14. Microelectronic component according to claim 11, wherein the component body has maximum lateral dimensions of 2 to 10 mm, and a thickness of 0.1 to 1.0 mm.

15. Microelectronic component according to claim 1, wherein the component body has maximum lateral dimensions of 2 to 10 mm, and a thickness of 0.1 to 1.0 mm.

16. Microelectronic component according to claim 12, wherein the connecting electrodes are placed on opposed surfaces of component body.

17. Microelectronic component according to claim 16, wherein the connecting electrodes comprise a grid of individual microelectrodes.

18. Microelectronic component according to claim 2, wherein connecting electrodes comprise a grid of individual microelectrodes.

19. Microelectronic component according to claim 2, wherein control electrodes are provided on the component body oriented crosswise relative to the connecting electrodes.

20. Microelectronic component according to claim 1, wherein the component is operable at room temperature.

21. Microelectronic component according to claim 20, wherein the component is operable in an inert gas atmosphere.

22. Microelectronic component according to claim 1, wherein the component is operated in an inert gas atmosphere.

23. Microelectronic component according to claim 1, wherein the said means for applying said external excitation parameter to the component body comprises means for applying ultrahigh frequency waves to the component body.

24. Microelectronic component according to claim 23, wherein the said means for applying ultrahigh frequency waves to the component body is operable to provide wave in a frequency range of light.

25. Microelectronic component according to claim 24, wherein the cluster nucleus of the cluster compound consists of atoms of a transition metal.

26. Microelectronic component according to claim 24, wherein the cluster nucleus of the at least one molecular cluster comprises atoms of a metal selected from the group consisting of silver (Ag), gold (Au), cobalt (Co), palladium (Pd), platinum (Pt), rhodium (Rh), ruthenium (Ru).

27. Microelectronic component according to claim 24, wherein the atoms in the cluster nucleus of the at least one molecular cluster are present as two shells in close-packed sphere packing.

28. Microelectronic component according to claim 24, wherein the ligand shell of the at least one molecular cluster is made of phosphane molecules and chlorine atoms.

29. Microelectronic component according to claim 24, wherein the at least one molecular cluster has an outside diameter of about 2 nm, with a diameter of the cluster nucleus of about 1.2 to 1.6 nm.

30. Microelectronic component according to claim 24, wherein at least two connecting electrodes are mechanically connected with the cluster compound of the body as a means for electrically connecting the component to an electronic circuit.

31. Microelectronic component according to claim 24, wherein a layer of molecular clusters of the cluster compound are bonded together to form the component body by being bonded to the connecting electrodes.

32. Microelectronic component according to claim 24, wherein the component body is formed of powdered or granular molecular clusters of the cluster compound which have been pressed at a pressure of at least about $10^8$ Pa into a mechanically interconnected component body.

33. Microelectronic component according to claim 32, wherein said means for applying said external excitation parameter to the component body comprises at least two connecting electrodes which are mechanically connected with the cluster compound of the body as a means for electrically connecting the component to an electronic circuit, said connecting electrodes having been simultaneously bonded with the cluster compound of component body during the formation thereof.

34. Microelectronic component according to claim 24, wherein a plurality of component bodies are dispersed in an embedding material.

35. Method of controlling a microelectronic component comprised of a plurality adjoining molecular clusters of a cluster compound, each said molecular cluster having a metallic cluster nucleus and an insulating ligand shell externally shielding and stabilizing the cluster nucleus in a manner enabling excitation of free electrons in the cluster nucleus by action of an external excitation parameter on the cluster molecules, and means for applying said external excitation parameter to the component body, comprising the steps of applying said external excitation parameter to the component body by at least two connecting electrodes electrically connected with the material of the body.

36. Method of controlling a microelectronic component according to claim 35, wherein said component body is simultaneously irradiated with light during application of said excitation parameter, said irradiation with light being controlled so as to cause absorption and subsequent emission of light by the component body.

37. Method of controlling a microelectronic component according to claim 36, wherein said external excitation is performed using frequencies in a range between 10 Hz and 10 Mhz.

38. Method of controlling a microelectronic component according to claim 35, wherein said external excitation is performed using frequencies in a range between 10 Hz and 10 Mhz.

* * * * *